United States Patent [19]

Dumbri

[11] Patent Number: 4,529,889
[45] Date of Patent: Jul. 16, 1985

[54] SENSE AMPLIFIER LATCH VOLTAGE WAVEFORM GENERATOR CIRCUIT

[75] Inventor: Austin C. Dumbri, Easton, Pa.

[73] Assignee: AT&T Bell Laboratories, Murray Hill, N.J.

[21] Appl. No.: 441,954

[22] Filed: Nov. 15, 1982

[51] Int. Cl.³ .......................... H03K 5/13; H03K 5/12
[52] U.S. Cl. .................... 307/269; 307/263; 307/268; 307/578; 307/530
[58] Field of Search ............... 307/269, 470, 473, 482, 307/530, 578, 263, 268

[56] References Cited

U.S. PATENT DOCUMENTS

| | | | |
|---|---|---|---|
| 3,898,479 | 8/1975 | Proebsting | 307/470 X |
| 3,937,983 | 2/1976 | Reed | 307/482 |
| 4,087,704 | 5/1978 | Mehta et al. | 307/530 X |
| 4,388,538 | 6/1983 | Ikeda | 307/578 X |

FOREIGN PATENT DOCUMENTS 0048922  4/1982  European Pat. Off. ............ 307/482

OTHER PUBLICATIONS

Lee et al., "Bit-Line Latch Gating Circuit for Field-Effect Transistor Memory", *IBM Tech. Discl. Bull.*, vol. 17, No. 5, pp. 1370–1371, 10/74.

*Primary Examiner*—Larry N. Anagnos
*Attorney, Agent, or Firm*—Irwin Ostroff

[57] ABSTRACT

A sense amplifier latch voltage waveform generator circuit provides an output voltage waveform which first increases to a first potential level, which is just below the threshold voltage of a field effect transistor, and subsequently increases with an ever-increasing slope over a useful voltage range. The generated voltage waveform is applied to the gate terminal of a latch field effect transistor, which is part of a sense amplifier circuit that includes a cross-coupled pair of field effect transistors whose sources are coupled to the drain of the latch transistor and whose drain terminals receive differential memory signals. The generator circuit consists essentially of an input gating transistor, an output stage having serially connected pull-up and pull-down transistors, and another similar feedback stage which includes a bootstrap capacitor. The bootstrap capacitor is coupled to the output stage.

13 Claims, 1 Drawing Figure

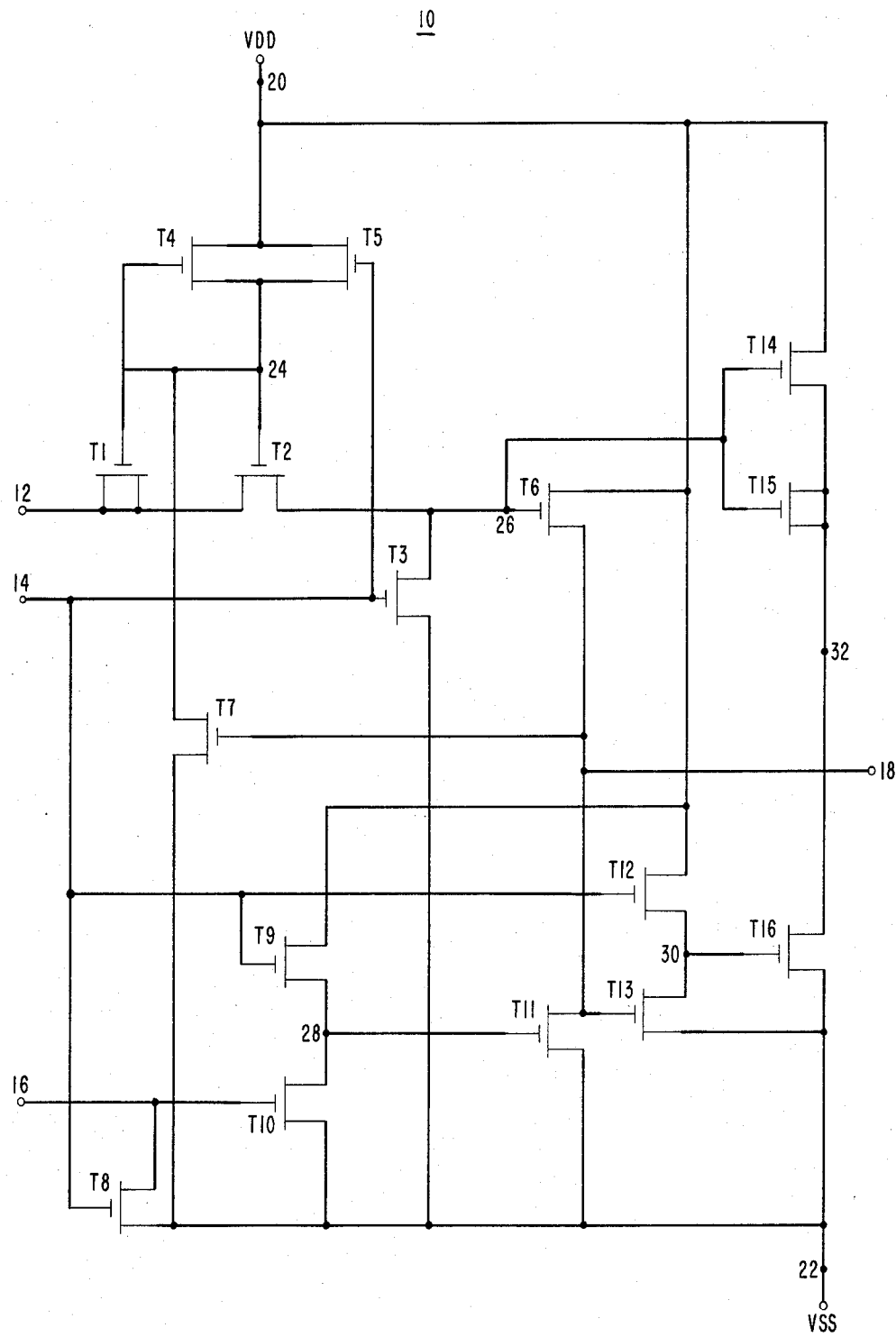

SENSE AMPLIFIER LATCH VOLTAGE WAVEFORM GENERATOR CIRCUIT

BACKGROUND OF THE INVENTION

This invention relates to voltage generator circuitry and, in particular, to sense amplifier latch voltage waveform generator circuits.

Many of today's n-channel field effect transistor dynamic random access memories use a sense amplifier having a cross-coupled pair of transistors with the sources being coupled to the drain of a latch transistor. A generator circuit producing a latch voltage waveform is connected to the gate of the latch transistor. The generator circuit used generally consists of a plurality of parallel field effect transistors of ever-decreasing resistance with separate delay elements connecting the respective gate terminals. A voltage latch waveform (an enabling signal), applied to the gate of the first of the parallel transistors, turns on the first transistor and then thereafter, at selected time intervals, turns on each of the next of the plurality of parallel transistors. As each of the parallel transistors turns on, the output potential of the generator circuit changes to bias the latch transistor more heavily on. One problem with this type of generator circuit is that the response time is slower than is desired in some applications. Another problem is that the slope of the produced voltage waveform increases essentially in steps as each of the parallel transistors turns on and is not essentially ever-increasing after a threshold voltage is reached. Still another problem is that the generator circuits are moderately complex and require more silicon area for implementation than is desirable in some applications.

It is desirable to have a sense amplifier latch voltage waveform generator circuit which produces an output voltage waveform that has essentially an ever-increasing slope over a useful voltage range after a threshold potential level is reached and which can be implemented in a relatively moderate area of silicon.

SUMMARY OF THE INVENTION

The present invention is directed to voltage waveform generator circuitry which generates an output voltage waveform that is at a potential level which is below the threshold voltage of a field effect transistor and then changes in potential level to a level above the threshold voltage and continues to change in potential level with a slope which is essentially ever-increasing with time over a useful voltage range. Such circuitry is useful as a latch voltage waveform generator circuit of today's latching type cross-coupled field effect transistor sense amplifiers. The characteristic of the waveform of the generator circuitry of the present invention is such that the sense amplifier turns on relatively slowly at first until a significant voltage imbalance is created at input/output terminals thereof, and thereafter it turns on with increasing speed until useful potentials are created at the input/output terminals thereof.

In one embodiment, the voltage generator of the present invention is circuitry comprising first, second, third, and fourth switching devices, a capacitor means having first and second terminals, and a delay circuit means having first and second terminals. Each of the switching devices has first and second output terminals and a control terminal. A first circuitry input terminal is coupled to the control terminals of the first and third switching devices and to the first terminal of the capacitor means. A second circuitry input terminal is coupled to the control terminal of the second switching device. A circuitry output terminal is coupled to the second output terminal of the first switching device, to the first output terminal of the second switching device, and to the first terminal of the delay circuit means. The second output terminal of the delay circuit means is coupled to the control terminal of the fourth switching device. The second terminal of the capacitor means is coupled to the second output terminal of the third switching device and to the first output terminal of the fourth switching device.

These and other features and advantages of the invention are better understood from a consideration of the following detailed description taken in conjunction with the accompanying drawing.

BRIEF DESCRIPTION OF THE DRAWING

The FIGURE illustrates an embodiment in accordance with the present invention.

DETAILED DESCRIPTION

Referring now to the FIGURE, there is illustrated circuitry 10 comprising field effect transistors T1, T2, T3, T4, T5, T6, T7, T8, T9, T10, T11, T12, T13, T14, T15, and T16. Circuitry 10 has input terminals 12, 14, and 16, and output terminal 18, and is adapted to be coupled to a first potential level VDD at a terminal 20 and is further adapted to be coupled to a second potential level VSS at a terminal 22. Circuitry 10 is well adapted for use as the latch voltage generator circuit for the latch transistor (not illustrated) of a latching type cross-coupled transistor sense amplifier (not illustrated) which is used with many of today's dynamic random access memories. It produces a voltage waveform at output terminal 18 which first achieves a potential which is essentially close to but below that necessary to turn on the latching transistor of the sense amplifier and then thereafter produces an output voltage waveform which has an essentially ever-increasing slope over a useful voltage range.

The drains of T4, T5, T6, T9, T12, and T14 are all coupled together to terminal 20 and to potential source VDD. The sources of T3, T7, T8, T10, T11, T13, and T16 are all coupled to terminal 22 and to potential source VSS. Input terminal 12 is coupled to the drain and source of T1 and to the drain of T2. The source of T2 is coupled to the drain of T3, to the gates of T6, T14, and T15, and to a terminal 26. The gates of T1, T2, and T4, the sources of T4 and T5, and the drain of T7 are all coupled to a terminal 24. The gate of T3 is coupled to the gates of T5, T9, and T12 and to input terminal 14. The gate of T7 is coupled to the source of T6, the drain of T11, the gate of T13, and to output terminal 18. The source of T14 is coupled to the drain and source of T15, to the drain of T16, and to a terminal 32. The gate of T10 and the drain of T8 are coupled to input terminal 16. The source of T9 is coupled to the drain of T10, the gate of T11, and to a terminal 28. The source of T12 is coupled to the drain of T13, to the gate of T16, and to a terminal 30.

T1 and T15 both effectively act as capacitors when the potentials of the gate terminals are of the right polarity and level to create a channel between the respective drains and sources. T1 is used essentially as a feedforward bootstrap capacitor. T15 is used essentially as a feedback bootstrap capacitor.

The combination of T12 and T13 and the combination of T9 and T10 both act as inverter circuits which have a preselected amount of delay and as such also act as delay elements.

T1, T4, T5, and T7 act to control the potential of terminal 24. With a low level signal, a "0" (typically at or near VSS in potential) applied to input terminal 12 and a high level signal, a "1" (typically at or near VDD in potential) applied to input terminal 14, T5 is biased on, and terminal 24 assumes a potential level of VDD minus the threshold voltage of T5, assuming that the potential level of the "1" is VDD. If the potential level of the "1" is VDD minus a threshold voltage, then the resulting potential of terminal 24 is VDD minus two threshold voltages. If input terminal 12 is now pulsed to a "1" and input terminal 14 is pulsed to a "0", then terminal 24 is pulsed to typically VDD plus one threshold voltage because of the capacitive coupling of terminals 12 and 24 through T1. The parasitic drain-to-gate capacitance (not illustrated) of T2 also serves to bootstrap the potential of terminal 24. The potential of terminal 24 is essentially clamped to a level no more positive than VDD plus one threshold voltage because T4 is biased on and will discharge terminal 24 to essentially one threshold voltage above VDD. The biasing of terminal 24 to VDD plus one threshold voltage will permit a full level "1" to be transmitted through T2 and thus allow terminal 26 to reach the full "1" level. As will be discussed later, terminal 26 will subsequently be bootstrapped in potential by T15 to a potential level at or above VDD plus one threshold voltage. The parasitic source-to-gate capacitances (not illustrated) of T6 and T14 also serve to bootstrap the potential of terminal 26. The limiting of the potential on terminal 24 to VDD plus one threshold voltage keeps T2 essentially off when the potential of terminal 26 is at or above VDD plus one threshold voltage, and terminal 12 is at or near VDD. Thus, terminal 26 can remain at the bootstrapped potential level and does not discharge through T2 down to the VDD (the present potential level of input terminal 12). T7 serves to selectively set terminal 24 to a potential level at or close to VSS. This biases off T1 and T2.

The operation of circuit 10 is as follows: Initially input terminal 14 is held at a "1", a potential level at or near the potential of VDD, and input terminals 12 and 16 are held at "0's", a potential level at or near the potential of VSS. Under these initial conditions, T1, T2, T3, T5, T8, T9, T11, T12, and T16 are biased on, and T4, T6, T7, T10, T13, T14, and T15 are biased off. These conditions cause output terminal 18 and terminals 26 and 32 to be set to potential levels at or close to VSS and cause terminals 24, 28, and 30 to be at potential levels at or near one threshold below VDD. After these initial conditions are established, terminal 12 is pulsed to a "1", terminal 14 is pulsed to a "0", and terminal 16 remains a "0". These new conditions bias off T3, T4, T8, T9, and T12 and bias on T4, T6, T14, and T15. Terminals 28 and 30, which were previously at or near the potential of one threshold below VDD, essentially stay at (float at) the previously set potential, and thus T11 and T16 remain biased on. T6 and T11 are designed such that with both biased on and conducting, the potential of output terminal 18 is close to but below the threshold potential of a field effect transistor. Thus, terminal 18 assumes a potential of approximately just less than one threshold potential above VSS. This keeps T13 off and thus allows T16 to stay biased on as terminal 30 is electrically floating at or near the potential of one threshold below VDD. This maintains terminal 32 at or near the potential of VSS.

After these conditions are established, terminal 16 is pulsed to a "1" from a "0", and terminals 12 and 14 remain at the "1" and "0" levels, respectively. These conditions bias on T10 and cause terminal 28 to begin to drop in potential towards a potential at or near VSS. This biases T11 off and allows output terminal 18 to start to rise from the potential of somewhat less than a threshold voltage above VSS towards VDD. As the potential of terminal 18 rises to one threshold voltage above VSS, T13 begins to be biased on, and terminal 30 begins to drop in potential towards VSS. This starts to bias off T16. As T16 starts to turn off, terminal 32 starts to rise in potential from close to VSS towards VDD. Since T14 and T15 are biased on, they both act as capacitors which bootstrap upward the potential of terminal 26. This increases the drive bias on the gate of T6 and causes it to be increasingly more conductive which causes output terminal 18 to more rapidly increase in potential. The resulting slope of waveform appearing at output terminal 18 is essentially ever increasing at this point over a range of several volts. This in turn causes T13 to be biased on more heavily and thus causes terminal 30 to more rapidly approach VSS. This in turn further reduces the bias on T16 which begins to turn off more rapidly and thus allows the potential of terminal 32 to rise further and faster. This in turn causes the slope of the potential bias on the gate of T6 (terminal 26) to further increase and thus results in the potential voltage waveform appearing at output terminal 18 to have an ever-increasing slope from the potential of just below one threshold voltage to a potential level several volts higher.

Circuitry 10 thus achieves the result of generating a voltage waveform at output terminal 18 which has an ever-increasing slope over a useful voltage range. Circuitry 10 has been fabricated in silicon on a single chip as part of a 256K dynamic random access memory (DRAM) using enhancement mode n-channel insulated gate field effect transistors. It has been tested and found to be functional. The channel widths of transistors T2, T3, T4, T5, T6, T7, T8, T9, T10, T11, T12, T13, T14, and T16 are 35, 5, 28, 8, 80, 24, 10, 40, 5, 200, 5, 8, 10, and 70 microns, respectively. The areas of transistors (capacitors) T1 and T15 are 240 and 450 microns square, respectively. The channel lengths of T2, T4, T5, T6, T8, T9, T11, T12, T13, T14, and T16 are all essentially 2.25 microns. The channel lengths of T3, T7, and T10 are 2.75, 2.75, and 4.5 microns, respectively. VDD and VSS are +5 volts and 0 volts, respectively. Two of the illustrated circuitry 10 latch voltage generators were used to control the 1024 sense amplifiers used in the 256K DRAM.

The embodiments described herein are intended to be illustrative of the general principles of the present invention. Various modifications are possible consistent with the spirit of the invention. For example, n-channel insulated gate field effect transistors could be substituted for the n-channel devices, provided the polarities of the power supplies and the input signals are appropriately modified. Still further, all transistors illustrated coupled to VDD could be depletion mode type field effect transistors, as could the two transistors used as capacitors. The capacitors could be a variety of types which are not field effect transistors. Still further, the combination of T9 and T10, and the combination of T12 and T13, can be replaced by a variety of different types of inverter-delay circuits.

What is claimed is:

1. Circuitry comprising:

first, second, third, and fourth switching devices each having a control terminal and first and second output terminals;

capacitor means having a first terminal coupled to the control terminals of the first and third devices and having a second terminal coupled to the second output terminal of the third device and to the first output terminal of the fourth device;

delay means having first and second terminals;

the second output terminal of the first device being coupled to the first output terminal of the second device, to the first terminal of the delay means, and to a circuitry output terminal;

the second terminal of the delay means being coupled to the control terminal of the fourth device;

first and second input circuitry terminals being coupled to the control terminals of the first device and the second device, respectively;

the first and second devices being characterized in that during a portion of operation of the circuitry when both are conducting simultaneously, a potential level is selectively developed at the output circuitry terminal which is below that necessary to bias on an additional switching device which is connectable to the output terminal of the circuitry.

2. The circuitry of claim 1 further comprising:

a first gating means coupled by a first terminal thereof to the first input circuitry terminal and coupled by a second terminal thereof to the control terminal of the first device; and a second gating means coupled by a first terminal thereof to the second input circuitry terminal and coupled by a second terminal thereof to the control terminal of the second device.

3. The circuitry of claim 2 wherein the delay means comprises an inverter circuit having an input terminal being the first terminal thereof and an output terminal being the second terminal thereof.

4. The circuitry of claim 3 wherein:

the first gating means comprises fifth, sixth, seventh, eighth, and ninth switching devices which each have a control terminal and first and second output terminals;

a second capacitor means having a first and second terminal, the first terminal of the second capacitor means being coupled to the input circuitry terminal and to the first output terminal of the seventh device, the second terminal of the second capacitor means being coupled to the control terminals of the fifth and seventh switching devices, to the second output terminals of the fifth and sixth switching devices, and to the first output terminal of the ninth switching device;

the second output terminal of the seventh device being coupled to the second output terminal of the eighth device and to the control terminal of the first device; the control terminals of the sixth and eighth switching devices being responsive to a further input terminal; and the control terminal of the ninth switching device being coupled to the circuitry output terminal.

5. The circuitry of claim 4 wherein:

the second gating means comprises tenth, eleventh, and twelfth switching devices which have a control terminal and first and second output terminals;

the first output terminal of the tenth switching device and the control terminal of the twelfth switching device being coupled to the second input circuitry terminal; and the second output terminal of the eleventh switching device being coupled to the first output terminal of the twelfth switching device and to the control terminal of the second device.

6. The circuitry of claim 5 wherein:

the inverter circuit comprises thirteenth and fourteenth switching devices each having a control terminal and first and second output terminals;

the control terminals of the thirteenth and fourteenth switching devices being respectively coupled to the said further input terminal and to the output circuitry terminal; and the second output terminal of the thirteenth switching device being coupled to the first output terminal of the fourteenth switching device and to the control terminal of the fourth device.

7. The circuitry of claim 6 further comprising a third input circuitry terminal being commonly coupled to the control terminals of the sixth, eighth, tenth, eleventh, and thirteenth devices.

8. The circuitry of claim 7 wherein:

the first capacitor means comprises a fifteenth switching device having a control terminal which serves as the first terminal thereof and having first and second output terminals coupled together to form the second terminal thereof; and the second capacitor means comprises a sixteenth switching device having a control terminal which serves as the second terminal thereof and having first and second output terminals coupled together to form the first terminal thereof.

9. The circuitry of claim 8 wherein all of the switching devices are separate field effect transistors.

10. The circuitry of claim 9 wherein all of the field effect transistors are n-channel.

11. The circuitry of claim 9 wherein all of the field effect transistors are p-channel.

12. Voltage generator circuitry coupled to a transistor of a circuit which is controlled by the voltage generator circuitry comprising:

first and second output field effect transistors and first and second feedback field effect transistors, each of the transistors having first and second output terminals and a control terminal;

capacitor circuit means having a first terminal coupled to the control terminals of the first output and feedback transistors and having a second terminal coupled to the second output terminal of the first feedback transistor and to the first output terminal of the second feedback transistor;

delay circuit means having first and second terminals;

the second output terminal of the first output transistor being coupled to the first output terminal of the second output transistor, to the first terminal of the delay circuit means, and to a circuitry output terminal;

the second terminal of the delay circuit means being coupled to the control terminal of the second feedback transistor;

first and second input circuitry terminals being coupled to the control terminals of the first and second output transistors, respectively;

the first and second output transistors being characterized in that during a portion of operation of the circuitry when both are simultaneously biased on and conducting, and when appropriate potentials are applied to the first output terminal of the first output transistor and to the second output terminal of the second output transistor, that a potential level is established at the circuitry output terminal which is typically close to but below that necessary to bias on the transistor of the circuit coupled to the voltage generator circuitry.

13. The circuitry of claim 12 further comprising:

a first gating circuit means coupled between the first input circuitry terminal and the control terminal of the first output transistor; and a second gating circuit means coupled between the second input circuitry terminal and the control terminal of the second output transistor.

* * * * *

UNITED STATES PATENT AND TRADEMARK OFFICE
CERTIFICATE OF CORRECTION

PATENT NO. : 4,529,889

DATED : July 16, 1985

INVENTOR(S) : Austin C. Dumbri

It is certified that error appears in the above-identified patent and that said Letters Patent is hereby corrected as shown below:

Column 3, line 57, "T4" should read --T5--.
Column 4, line 59, "n-channel" should read --p-channel--.

Signed and Sealed this

Seventh Day of January 1986

[SEAL]

Attest:

DONALD J. QUIGG

Attesting Officer

Commissioner of Patents and Trademarks